United States Patent
Hueber et al.

(10) Patent No.: US 10,396,912 B1
(45) Date of Patent: Aug. 27, 2019

(54) METHOD AND SYSTEM FOR A SUBSAMPLING BASED SYSTEM INTEGRATED SCOPE TO ENHANCE SAMPLE RATE AND RESOLUTION

(71) Applicant: NXP B.V., Eindhoven (NL)

(72) Inventors: Gernot Hueber, Linz (AT); Ian Thomas Macnamara, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/120,210

(22) Filed: Aug. 31, 2018

(51) Int. Cl.
*H04B 17/29* (2015.01)
*H04B 1/30* (2006.01)

(52) U.S. Cl.
CPC .............. *H04B 17/29* (2015.01); *H04B 1/30* (2013.01)

(58) Field of Classification Search
CPC .................................. H04B 17/29; H04B 1/30
See application file for complete search history.

(56) References Cited

U.S. PATENT DOCUMENTS

| | | | | |
|---|---|---|---|---|
| 4,495,586 A * | 1/1985 | Andrews | ................. | G01R 13/34 315/367 |
| 4,694,244 A * | 9/1987 | Whiteside | ............ | G01R 13/345 324/121 R |
| 5,260,670 A * | 11/1993 | Ainsworth | ........... | G01R 13/345 327/94 |
| 6,856,924 B2 * | 2/2005 | MacDonald | ........... | G01R 13/28 324/120 |
| 7,227,479 B1 * | 6/2007 | Chen | ................... | H03M 1/1004 341/118 |
| 8,310,387 B2 * | 11/2012 | Harris | ................. | H03M 1/0836 341/118 |
| 8,890,739 B2 * | 11/2014 | Lewis | ................. | H03M 1/1061 341/118 |
| 9,620,227 B1 | 4/2017 | Battaje et al. | | |
| 9,793,910 B1 * | 10/2017 | Devarajan | ........... | H03M 1/0634 |
| 2006/0194552 A1 * | 8/2006 | Jin | ......................... | H04B 17/21 455/226.1 |
| 2007/0207757 A1 | 9/2007 | Qi et al. | | |
| 2009/0160569 A1 | 6/2009 | Gros | | |

(Continued)

OTHER PUBLICATIONS

"Oscilloscope Fundamentals", Tektronix, 60 pgs., retrieved from the internet at: https://engineering.case.edu/lab/circuitslab/sites/engineering.case.edu.lab.circuitslab/files/docs/Oscilloscope_Fundamentals_-_Tektronix.pdf (Oct. 2008).

(Continued)

*Primary Examiner* — Devan A Sandiford

(57) ABSTRACT

This specification discloses methods and systems for implementing a chip integrated scope (i.e., chip scope (CS)), which is a feature that allows a user to scope RF signals (internally and externally to the DUT (device under test)), by using the RF receive path (including amplifier, filter, ADC, DSP) to capture and store signal traces. In some embodiments, this specification discloses methods and systems to enhance the sampling rate and resolution of these signal traces by using subsampling techniques where a post-processing merges the subsampled traces (with different phase-shifts of say, for example, 0°, 90°, 180°, and 270°) into a single trace that will appear to have a sampling rate that is higher than a pre-determined sampling rate used to collect these subsampled traces.

20 Claims, 10 Drawing Sheets

(56) References Cited

U.S. PATENT DOCUMENTS

| | | |
|---|---|---|
| 2009/0310651 A1* | 12/2009 | Amde .................. H04B 1/7075 |
| | | 375/147 |
| 2010/0289679 A1 | 11/2010 | Dasnurkar |
| 2011/0098964 A1 | 4/2011 | Mullane et al. |
| 2013/0021048 A1 | 1/2013 | Peng et al. |
| 2013/0294490 A1 | 11/2013 | Chandraesekaran et al. |
| 2014/0154997 A1 | 6/2014 | Chen et al. |
| 2016/0050034 A1* | 2/2016 | Pearse ..................... G01S 19/03 |
| | | 455/67.14 |
| 2016/0109327 A1 | 4/2016 | Viswanathan |
| 2016/0197684 A1 | 7/2016 | Tsai et al. |
| 2016/0204881 A1 | 7/2016 | Chung et al. |
| 2016/0211861 A1 | 7/2016 | Op't Eynde et al. |
| 2016/0248459 A1 | 8/2016 | Gan et al. |
| 2016/0329972 A1 | 11/2016 | Dominizi et al. |
| 2018/0059215 A1 | 3/2018 | Turbiner et al. |
| 2019/0025372 A1 | 1/2019 | Waelchli |

OTHER PUBLICATIONS

Chen, T.-M. et al. "A 2×2 MIMO 802.11 abgn/ac WLAN SoC with integrated T/R switch and on-chip PA delivering VHT80 256QAM 17.5dBm in 55nm CMOS", IEEE Radio Frequency Integrated Circuits Symposium, 4 pgs. (Jun. 2014).

Chung, Y.-H. et al. "A Dual-Brand 802.11abgn/ac Transceiver with Integrated PA and T/R Switch in a Digital Noise Controlled SoC", IEEE Custom Integrated Circuits Conference, 8 pgs. (2015).

Non-final Office Action for U.S. Appl. No. 16/050,929 dated Jul. 23, 2019, 24 pages.

* cited by examiner

METHOD AND SYSTEM FOR A SUBSAMPLING BASED SYSTEM INTEGRATED SCOPE TO ENHANCE SAMPLE RATE AND RESOLUTION

CROSS REFERENCE TO RELATED APPLICATIONS

This application is related to U.S. patent application Ser. No. 16/050,929, entitled "METHOD AND SYSTEM TO ENHANCE ACCURACY AND RESOLUTION OF SYSTEM INTEGRATED SCOPE USING CALIBRATION DATA" filed on Jul. 31, 2018, which is being incorporated herein by reference in its entirety.

FIELD

The described embodiments relate generally to methods and devices that provide for a chip integrated scope, and more particularly to methods and devices that provide for a subsampling based chip integrated scope with enhanced sample rate and resolution.

BACKGROUND

The use of an external instrument (i.e., external to a device or chip under test), such as an oscilloscope, to scope the device or chip under test for analyzing and debugging corner or error cases is very important. Such an instrument can be a very powerful tool that is used to locate some of the most complex and inconspicuous hardware and software defects.

Therefore, there are strong motivations to develop other methods and systems to perform the important task of scoping the device or chip under test for analyzing and debugging corner or error cases, wherein these other methods and systems can provide enhanced sample rate and resolution.

SUMMARY

This specification discloses methods and systems for implementing a chip integrated scope (i.e., chip scope (CS)), which is a feature that allows a user to scope RF signals (internally and externally to the DUT (device under test)), by using the RF receive path (including amplifier, filter, ADC (analog-to-digital converter), DSP (digital signal processor)) to capture and store signal traces. In some embodiments, this specification discloses methods and systems to enhance the resolution and accuracy of these signal traces by using subsampling of (repeating) signals to enhance sample rate and to enhance resolution. The benefits of these methods and systems include: (a) CS input pattern and CS output data (i.e., signal trace) can be synchronized; (b) Trigger can be generated within the system; (c) Test signal (e.g., SigGen) can be part of the system. Consequently, there can be a significant advantage that allows for simplification, higher accuracy, and lower cost.

In some embodiments, this specification discloses methods and systems to enhance the sampling rate and resolution of these signal traces by using subsampling techniques where a post-processing merges the subsampled traces (with different phase-shifts of say, for example, 0°, 90°, 180°, and 270°) into a single trace that will appear to have a sampling rate that is higher than a pre-determined sampling rate used to collect these subsampled traces. In some embodiments, if a post-processing merges 4 subsampled traces (with 4 different phase-shifts of 0°, 90°, 180°, and 270°) into a single trace, then that single trace will appear to have a sampling rate that is 4 times higher than a pre-determined sampling rate that was used to collect these 4 sub sampled traces. In some embodiments, if a post-processing merges X number of subsampled traces (with X different phase-shifts) into a single trace, then that single trace will appear to have a sampling rate that is X times higher than a pre-determined sampling rate that was used to collect these X number of subsampled traces.

The present invention provides for a device for receiving a RF (radio frequency) signal and converting the RF signal to a digital data sample, the device comprising: (a) a digital data memory; (b) a receiver, the receiver configured to providing a repeating digital data sample to the digital data memory, wherein the receiver comprises a LO (local oscillator), wherein the repeating digital data sample is collected at a pre-determined sampling rate with zero phase shift of a sampling clock, wherein the sampling clock is based on the LO; (c) a phase selector; (d) an additional enhanced data memory configured to store an additional repeating digital data sample, wherein the additional repeating digital data sample is collected at the pre-determined sampling rate plus a phase shift of the sampling clock, wherein the phase shift is controlled by the phase selector; (e) a CS (chip scope) control unit, the CS control unit configured to control the phase selector and to synchronize the repeating digital data sample with the additional repeating digital data sample, (f) wherein the repeating digital data sample and the additional repeating digital data sample are merged by interleaving them into one single digital data sample, wherein the one single digital data sample will appear to have a sampling rate that is higher than the pre-determined sampling rate.

In some embodiments, the additional enhanced data memory is configured to store a total of three additional repeating digital data samples, (g) wherein the first additional repeating digital data sample is collected at the pre-determined sampling rate plus a 90° phase shift of the sampling clock, (h) wherein the second additional repeating digital data sample is collected at the pre-determined sampling rate plus a 180° phase shift of the sampling clock, (i) wherein the third additional repeating digital data sample is collected at the pre-determined sampling rate plus a 270° phase shift of the sampling clock, (j) wherein the repeating digital data sample and the three additional repeating digital data samples are merged by interleaving them into the one single digital data sample, wherein the one single digital data sample will appear to have a sampling rate that is four times higher than the pre-determined sampling rate.

In some embodiments, the additional enhanced data memory is configured to store a total of M additional repeating digital data samples, (g) wherein the first additional repeating digital data sample is collected at the pre-determined sampling rate plus a 360°/(M+1) phase shift of the sampling clock, (h) wherein the Nth additional repeating digital data sample is collected at the pre-determined sampling rate plus a N×360°/(M+1) phase shift of the sampling clock, (i) wherein the repeating digital data sample and the M additional repeating digital data samples are merged by interleaving them into the one single digital data sample, wherein the one single digital data sample will appear to have a sampling rate that is M+1 times higher than the pre-determined sampling rate.

In some embodiments, the one single digital data sample is a RF signal trace.

In some embodiments, the receiver is configured for receiving the RF signal for an NFC-enabled device, wherein NFC stands for near field communication.

In some embodiments, the phase selector is implemented by one or more of the following means: (i) selecting different phases in a clock divider tree, (ii) a phase shifter circuit, (iii) selecting different phases in a ring oscillator, (iv) programmable phase in a D-PLL (digital phase lock loop).

In some embodiments, the device further comprising: (g) a signal generator, a signal generator configured to be controlled by the CS control unit; (h) a transmitter, the transmitter configured to generate a RF (radio frequency) signal based on input from the signal generator.

In some embodiments, the transmitter provides the RF (radio frequency) signal as an input to the receiver on the same device.

In some embodiments, the CS control unit provides synchronization between the transmitter and the receiver on the same device.

In some embodiments, the device further comprising: (i) a second phase selector associated with the transmitter, wherein the CS control unit is configured to control both the phase selector associated with the receiver and the second phase selector associated with the transmitter, wherein both the phase selector and the second phase selector are used in combination to control the phase shift utilized for collecting the additional repeating digital data sample.

In some embodiments, the transmitter provides the RF (radio frequency) signal as an input to a second receiver on a second device, wherein the second device is comprised of the second receiver and a second CS (chip scope) control unit.

In some embodiments, the transmitter is synchronized with the second receiver of the second device by having a connection between the CS control unit of the device with the second CS control unit of the second device.

In some embodiments, the receiver is further comprised of: (i) an attenuator, (ii) a BBA (baseband amplifier), (iii) a down converter, wherein the down converter is comprised of: a mixer, the LO (local oscillator), an I/Q LO unit, (iv) an ADC (analog to digital converter).

In some embodiments, the repeating digital data sample and the additional repeating digital data sample are based on signals the receiver receives from one of the following sources: (i) sources external to the device, (ii) sources internal to the device, (iii) a combination of sources external to the device and sources internal to the device.

In some embodiments, the receiver receives signals from the sources internal to the device via one or more of the following functional blocks of the receiver: (i) the attenuator, (ii) the mixer, (iii) the BBA, (iv) the ADC.

In some embodiments, the CS (chip scope) control unit is configured to perform one or more of the following functions: (i) control receiver (Rx) path for sampling the repeating digital data sample, (ii) control transmitter (Tx) path for generating a RF (radio frequency) signal, (iii) control memory locations used to store the repeating digital data sample and the additional repeating digital data sample, (iv) act as a sequence control unit, the sequence control unit controlling timing and trigger for generating a RF (radio frequency) signal and sampling the repeating digital data sample.

The present invention also provides for a method to enhance a chip integrated scope of a device, the method comprising: (a) using a receiver of the device to receive a repeating RF (radio frequency) signal; (b) converting the repeating RF signal to a repeating digital data sample, wherein the repeating digital data sample is collected at a pre-determined sampling rate with zero phase shift of a sampling clock; (c) converting the repeating RF signal to an additional repeating digital data sample, wherein the additional repeating digital data sample is collected at the pre-determined sampling rate plus a phase shift of the sampling clock, wherein the phase shift is controlled by a phase selector of the device, wherein the phase selector is controlled by a CS (chip scope) control unit of the device; (d) merging the repeating digital data sample and the additional repeating digital data sample into one single digital data sample by interleaving them, wherein the one single digital data sample will appear to have a sampling rate that is higher than the pre-determined sampling rate.

In some embodiments, the method further comprising: (e) converting the repeating RF signal to a total of three additional repeating digital data samples, (i) wherein the first additional repeating digital data sample is collected at the pre-determined sampling rate plus a 90° phase shift of the sampling clock, (ii) wherein the second additional repeating digital data sample is collected at the pre-determined sampling rate plus a 180° phase shift of the sampling clock, (iii) wherein the third additional repeating digital data sample is collected at the pre-determined sampling rate plus a 270° phase shift of the sampling clock, (f) merging the repeating digital data sample and the three additional repeating digital data sample into the one single digital data sample by interleaving them, wherein the one single digital data sample will appear to have a sampling rate that is four times higher than the pre-determined sampling rate.

In some embodiments, the method further comprising: (e) converting the repeating RF signal to a total of M additional repeating digital data samples, (i) wherein the first additional repeating digital data sample is collected at the pre-determined sampling rate plus a $360°/(M+1)$ phase shift of the sampling clock, (ii) wherein the Nth additional repeating digital data sample is collected at the pre-determined sampling rate plus a $N \times 360°/(M+1)$ phase shift of the sampling clock, (f) merging the repeating digital data sample and the M additional repeating digital data sample into the one single digital data sample by interleaving them, wherein the one single digital data sample will appear to have a sampling rate that is M+1 times higher than the pre-determined sampling rate.

The present invention provides for a computer program product comprising executable instructions encoded in a non-transitory computer readable medium which, when executed by a system, carry out or control the following method to enhance a chip integrated scope of a device, the method comprising: (a) using a receiver of the device to receive a repeating RF (radio frequency) signal; (b) converting the repeating RF signal to a repeating digital data sample, wherein the repeating digital data sample is collected at a pre-determined sampling rate with zero phase shift of a sampling clock; (c) converting the repeating RF signal to an additional repeating digital data sample, wherein the additional repeating digital data sample is collected at the pre-determined sampling rate plus a phase shift of the sampling clock, wherein the phase shift is controlled by a phase selector of the device, wherein the phase selector is controlled by a CS (chip scope) control unit of the device; (d) merging the repeating digital data sample and the additional repeating digital data sample into one single digital data sample by interleaving them, wherein the one single digital data sample will appear to have a sampling rate that is higher than the pre-determined sampling rate.

DETAILED DESCRIPTION

Figure 1:
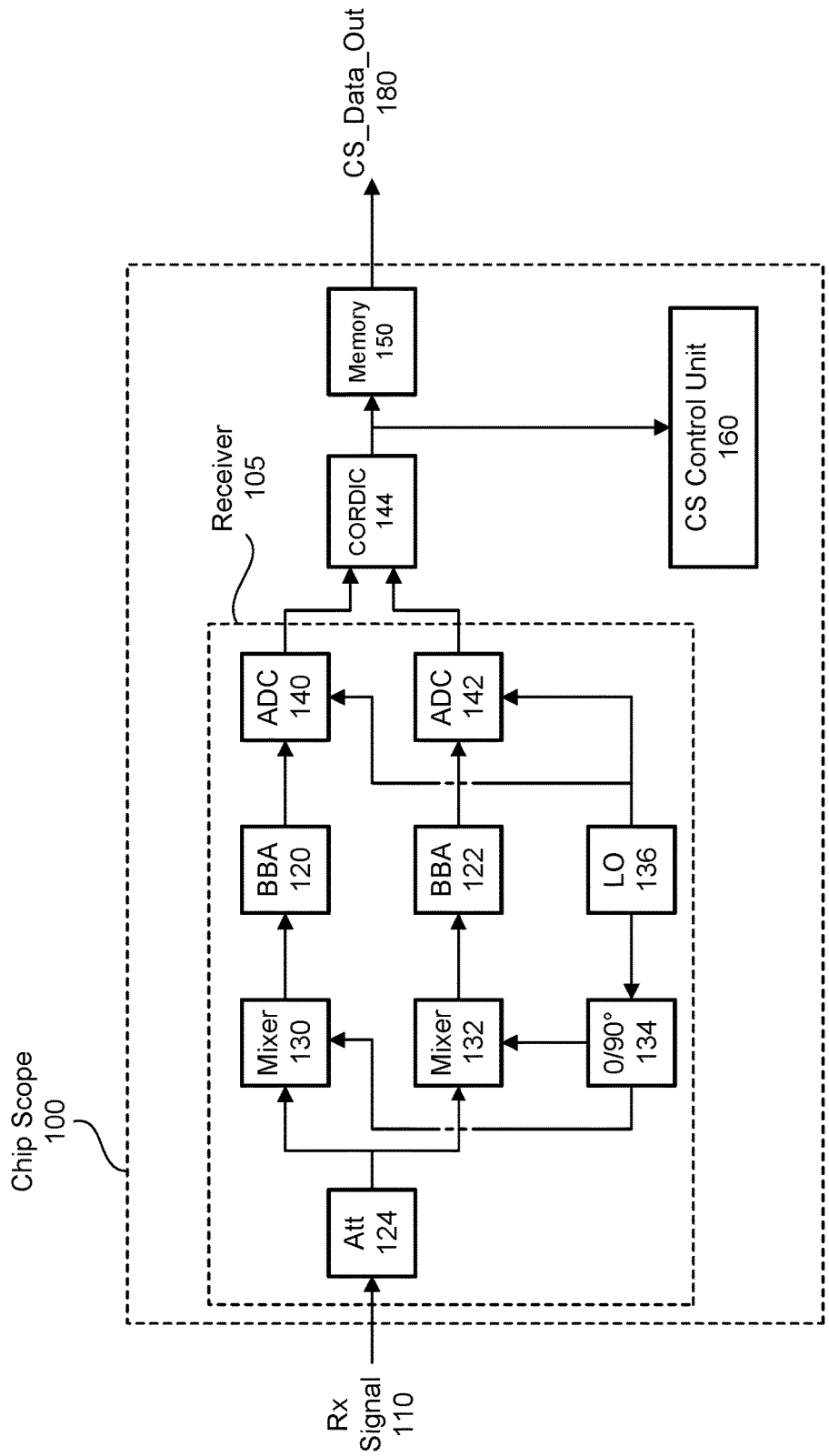
FIG. 1 shows a functional block diagram of a chip integrated scope (i.e., chip scope (CS)) in accordance with some embodiments of the invention.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Many systems, such as a RF (radio frequency) receiver system, can be implemented on a chip. As such, a system integrated scope can be characterized as a chip integrated scope. The chip integrated scope (i.e., chip scope (CS)) is a feature that allows a user to scope RF signals (internally and externally to the DUT (device under test)), by using the RF receive path (including amplifier, filter, ADC, DSP) to capture and store signal traces. In some embodiments, this specification discloses methods and systems to enhance the performance of the CS based on the existing design by using subsampling technique for the ADCs (analog-to-digital converters). The expectation is to improve the CS sample rate and resolution with no cost of additional silicon area, test time, or design effort. In some embodiments, this improvement in CS sample rate can be from 6.78 MHz to 27.12 MHz (based on 4-phase selector for LO) with no cost of additional silicon area, test time, or design effort. In some embodiments, this improvement in CS sample rate can be even higher (if based on a phase selector with more than 4 phase shift selections).

The CS feature allows a system (e.g., an IC (integrated circuit)) to detect internal or external signals and store the respective traces. In most cases, this feature is a test vehicle, to analyze and debug corner or error cases, or it may be used in test conditions to capture data with high accuracy. An example of such a use case is shown in FIG. 1.

In this regard, FIG. 1 shows a functional block diagram of a chip integrated scope (i.e., chip scope (CS)) in accordance with some embodiments of the invention. As shown in FIG. 1, a chip scope (CS) 100 includes a CS Control Unit 160, two Mixers (130, 132), two BBA (baseband amplifier) (120, 122), two ADC (analog to digital converter) (140, 142), a CORDIC (Coordinate Rotation Digital Computer) 144 (which is an optional component), and a memory 150. Please note that all the functional blocks (with the exception of the CS Control Unit 160) are blocks not specific to the CS (since they are actually all from the normal receive path). In other words, the CS does not impose any specific demanding specification on all these functional blocks (with the exception of the CS Control Unit 160).

Additionally, as shown in FIG. 1, the chip scope (CS) 100 also includes an attenuator 124, a LO (local oscillator) 136, and an I/Q LO unit (labeled as a 0/90° unit 134). Also shown in FIG. 1 is that the chip scope (CS) 100 receives a Rx (receiver) signal 110 as input, and then transmits a CS_Data_Out 180 as output. In other words, the CS 100 receives a RF (radio frequency) signal (e.g., Rx signal 110), and then transmits out a digital data sample (e.g., CS_Data_Out 180).

In some embodiments, the chip scope (CS) 100 can be a device for receiving a RF (radio frequency) signal and converting the RF signal to a digital data sample. In some embodiments, the raw digital data sample can be a RF signal trace. In some embodiments, the chip scope (CS) 100 can include: (a) a receiver 105, (b) a CORDIC 144, (c) a CS (chip scope) control unit, and (d) a digital data memory 150. However, the CORDIC is an optional component, because the CORDIC uses I/Q samples as input and converts those to magnitude A and phase phi values. Since the chip scope can store either (I/Q) or (A, phi) data in the digital data memory, that means the CORDIC component is optional. In other words, if CORDIC is not used, then the chip scope stores (I/Q) data in the digital data memory. However, if CORDIC is used, then the chip scope stores (A, phi) data in the digital data memory. Accordingly, in some embodiments, the receiver 105 can be configured to provide a raw digital data sample to the CORDIC 144. Then the CORDIC can be configured to processing the raw digital data sample from the receiver 105 before sending the raw digital data sample to the digital data memory 150. In some other embodiments, the receiver 105 can be configured to provide a raw digital data sample directly to the digital data memory, without the use of a CORDIC. In some embodiments, the receiver 105 can be configured for receiving the RF signal for an NFC-enabled device, wherein NFC stands for near field communication.

FIG. 1 also shows that some of the functional blocks can be grouped together to form a receiver (Rx) 105. As shown in FIG. 1, a receiver (Rx) 105 can include an attenuator 124, a LO (local oscillator) 136, an I/Q LO unit (labeled as a 0/90° unit 134), two Mixers (130, 132), two BBA (baseband amplifier) (120, 122), and two ADC (analog to digital converter) (140, 142).

It is not shown in FIG. 1, but, in some embodiments, a receiver (Rx) can include (a) a down converter, and (b) an ADC (analog to digital converter). In some embodiments, the receiver can further include one or more of the following: (c) a gain stage, and (d) a filter. In some embodiments, the gain stage can include (i) an attenuator, and (ii) a BBA (baseband amplifier). Therefore, in some embodiments, the receiver can further include one or more of the following: (c) an attenuator, (d) a BBA (baseband amplifier), and (e) a filter. In some embodiments, the down converter can include one or more of the following: (i) a mixer, (ii) a LO (local oscillator), and (iii) an I/Q LO unit. In some embodiment, the I/Q LO unit can be a 0/90° unit.

It is not shown in FIG. 1, but, in some embodiments, a chip scope (CS) can allow signals to be introduced at the attenuator or the mixer input. In some embodiments, the signal of interest can also be introduced at the ADC, BBA, mixer, or attenuator inputs (e.g., using a bypass of mixer or BBA, mux (or multiplexer), etc.).

Figure 2:
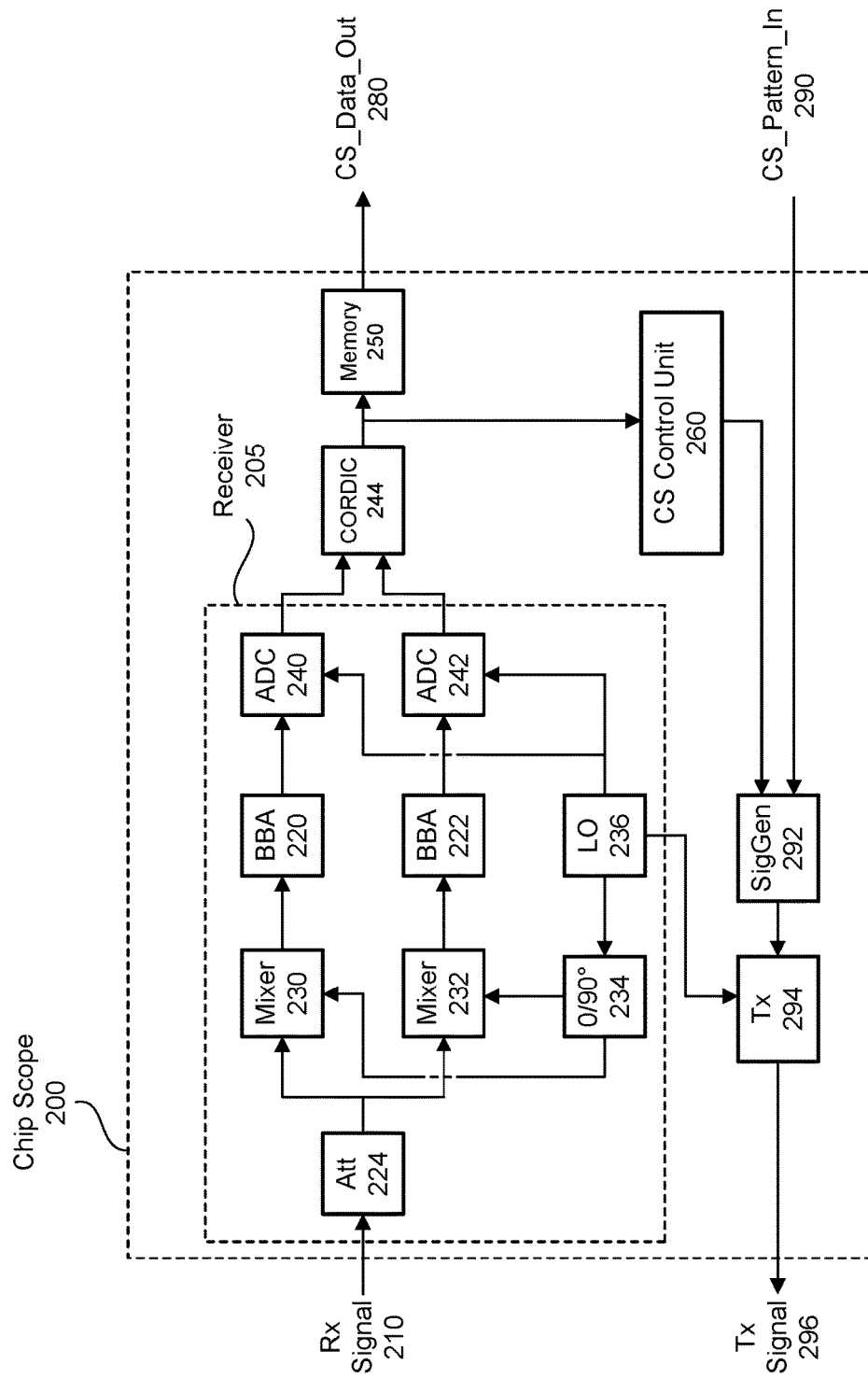
FIG. 2 shows a functional block diagram of an enhanced chip integrated scope (i.e., chip scope (CS)) with an integrated signal generator path in accordance with some embodiments of the invention.

FIG. 2 shows a functional block diagram of an enhanced chip integrated scope (i.e., chip scope (CS)) with an integrated signal generator path in accordance with some embodiments of the invention. With the addition of an integrated signal generator path, the chip scope (CS) is able to generate a Tx signal based on a CS input pattern (e.g., CS_Pattern_In 290). The Tx signal can then be used as an input for a chip scope (CS) on the same device or a chip scope (CS) on a different device (e.g., a DUT-DUT configuration, where DUT stands for device under test).

Chip scope (CS) 200 of FIG. 2 is very similar to chip scope (CS) 100 of FIG. 1. For example, chip scope (CS) 200 includes a receiver 205, a CS Control Unit 260, a CORDIC (Coordinate Rotation Digital Computer) 244 (which is an optional component), and a memory 250. Additionally, receiver 205 includes an attenuator 224, two Mixers (230, 232), two BBA (baseband amplifier) (220, 222), two ADC (analog to digital converter) (240, 242), a LO (local oscillator) 236, and an I/Q LO unit (labeled as a 0/90° unit 234).

FIG. 2 shows that the chip scope (CS) 200 receives a Rx (receiver) signal 210 as input, and then transmits a CS_Data_Out 280 as output. In other words, the CS 200 receives a RF (radio frequency) signal (e.g., Rx signal 210), and then transmits out a digital data sample (e.g., CS_Data_Out 280).

For the enhancement, chip scope (CS) 200 of FIG. 2 also includes an integrated signal generator path, which consists of a Tx (transmitter) 294 and a Signal Generator (SigGen 292). This integrated signal generator path enables chip scope (CS) 200 to generate a Tx signal 296 based on a CS input pattern (e.g., CS_Pattern_In 290). In other words, the CS 200 receives an input CS_Pattern_In 290, and then SigGen 292 is configured to enable Tx (transmitter) 294 to transmits out a Tx signal 296. As described earlier, the Tx signal 296 can be used as an input for a chip scope (CS) on the same device (i.e., chip scope 200), or a chip scope (CS) on a different device (e.g., a DUT-DUT configuration, where DUT stands for device under test).

In the embodiment where the Tx signal 296 is used as an input for a chip scope (CS) on the same device (i.e., chip scope 200), both the transmitter and receiver (i.e., Tx 294 and receiver 205) are on the same device (i.e., chip scope 200). Therefore, the CS control unit 260 can synchronize both the CS input pattern (i.e., CS_Data_Out 280) and the CS output data (i.e., CS_Data_Out 280). In some embodiments, the CS control unit 260 performs the synchronization by creating one or more triggers for generating both Tx signal 296 and CS_Data_Out 280. For example, the completion of a repeating signal (as detected by the CORDIC 244) can be a trigger for SigGen 292 to start the transmission of a new repeating signal by Tx 294.

As the chip scope (CS) can be based on the existing Rx (receive) path, many of the key performance specifications (such as sample rate, resolution, accuracy) are inherited from the existing Rx path. However, in (production) test conditions or debugging, this performance metrics might not be sufficient.

Therefore, if the chip scope (CS) specifications are based on the existing Rx (receive) path specifications, there can be fundamental limits on the chip scope (CS) performance, which in turn will limit the following targeted testing capabilities:

(a) Achieving a chip scope (CS) with higher sample rate and resolution so that the chip scope (CS) can replace an external oscilloscope in a production test. (This has the benefit of reducing test cost, as the DUT (device under test) can now be used as an "oscilloscope" substitute and this in turn replaces an external oscilloscope.)

(b) Using a chip scope (CS) to sample rising/falling edges (and over/undershoots) of a modulation signal to assess waveshape signal quality in, for example, a loopback or DUT-DUT case.

For the above use cases, it is important to improve the sample rate and resolution of a chip scope (CS). As such, this specification discloses methods and systems designed to enhance the performance of the chip scope (CS) based on existing HW (hardware) design. Hence, there is no need to push the HW (hardware) specifications way beyond what is needed in a normal communication use-case. There is also no need to impose new, stringent, or costly changes to the chip scope (CS) to improve the CS absolute gain accuracy. As an example, this enhancement in the CS accuracy can allow the CS to replace, in a production test, the external oscilloscope for measurement of the IC's capability. This will save the cost of the external oscilloscope, as well as significantly reduce the test time, since doing the test internally within the chip eliminates the need to control an external test equipment (oscilloscope), read out measured data (a trace), and then do correction of the data on a test-station controller.

Figure 3:
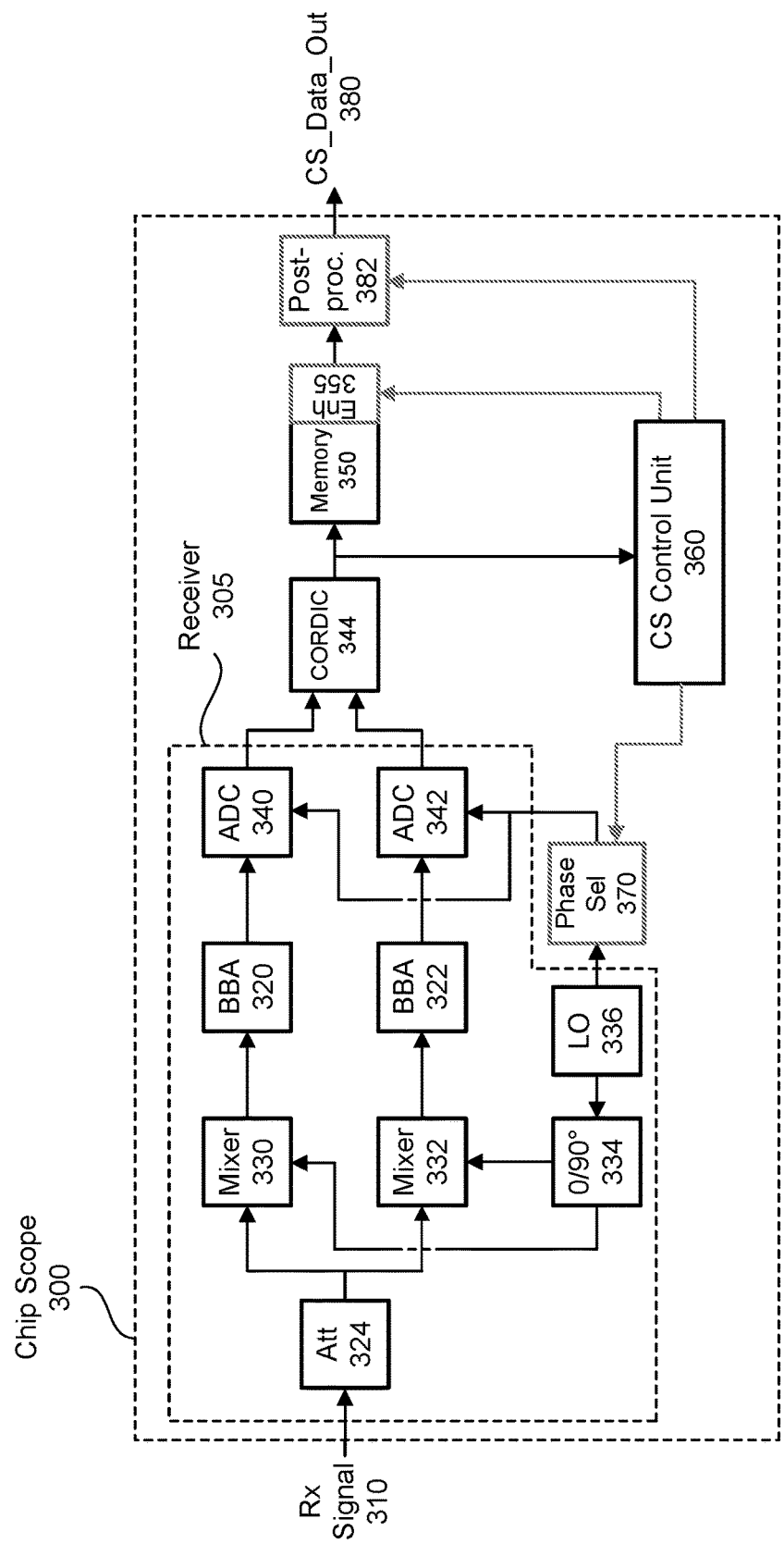
FIG. 3 shows a functional block diagram of an enhanced chip integrated scope (i.e., chip scope (CS)) using subsampling technique to enhanced sampling rate and resolution in accordance with some embodiments of the invention.

In some embodiments, in order to enhance the sampling rate and resolution of the CS, subsampling techniques can be used. As an example, subsampling techniques can improve the CS absolute gain accuracy from a sample rate of 6.78 MHz to 27.12 MHz (based on 4-phase selector for LO) or even higher. FIG. 3 shows an embodiment of how this enhancement can be implemented using: (a) additional control in the CS Control Unit, (b) Phase Selector, and (c) additional Enhanced Memory.

In this regard, FIG. 3 shows a functional block diagram of an enhanced chip integrated scope (i.e., chip scope (CS)) using subsampling technique to enhanced sampling rate and resolution in accordance with some embodiments of the invention.

The chip scope (CS) 300 shown in FIG. 3 is similar to the chip scope (CS) 100 shown in FIG. 1. For example, the chip scope (CS) 300 receives a Rx (receiver) signal 310 as input, and then transmits a CS_Data_Out 380 as output. In other words, the CS 300 receives a RF (radio frequency) signal (e.g., Rx signal 310), and then transmits out a digital data sample (e.g., CS_Data_Out 380). Additionally, the chip scope (CS) 300 of FIG. 3 includes a receiver 305, a CS Control Unit 360, a CORDIC 344 (which is an optional component), and a memory 350. Furthermore, the receiver 305 includes an attenuator 324, two Mixers (330, 332), two BBA (320, 322), two ADC (340, 342), a LO 336, and an I/Q LO unit (labeled as a 0/90° unit 334).

Moreover, chip scope (CS) 300 of FIG. 3 includes these new enhancement blocks, as compared with chip scope (CS) 100 of FIG. 1: (a) a phase selector 370, (b) an enhancement 355 applied to memory 350, (c) a post processing 382, and (d) additional connections from the CS Control Unit 360 to control these new enhancement blocks.

The phase selector 370 can implemented by different means.

In some embodiments, the phase selector can be implemented by selecting different phases in a clock divider tree. There can be, for example, N DIV2 blocks cascaded that divide a clock from frequency N×f down to frequency f. Depending on the selection of the phases for the cascaded DIV2 blocks, the phase of the last (output) stage is defined.

In some embodiments, the phase selector can be implemented with a phase shifter circuit.

In some embodiments, the phase selector can be implemented by selecting different phases in the ring oscillator.

In some embodiments, the phase selector can be implemented by programmable phase in a D-PLL (digital phase lock loop).

Figure 4:
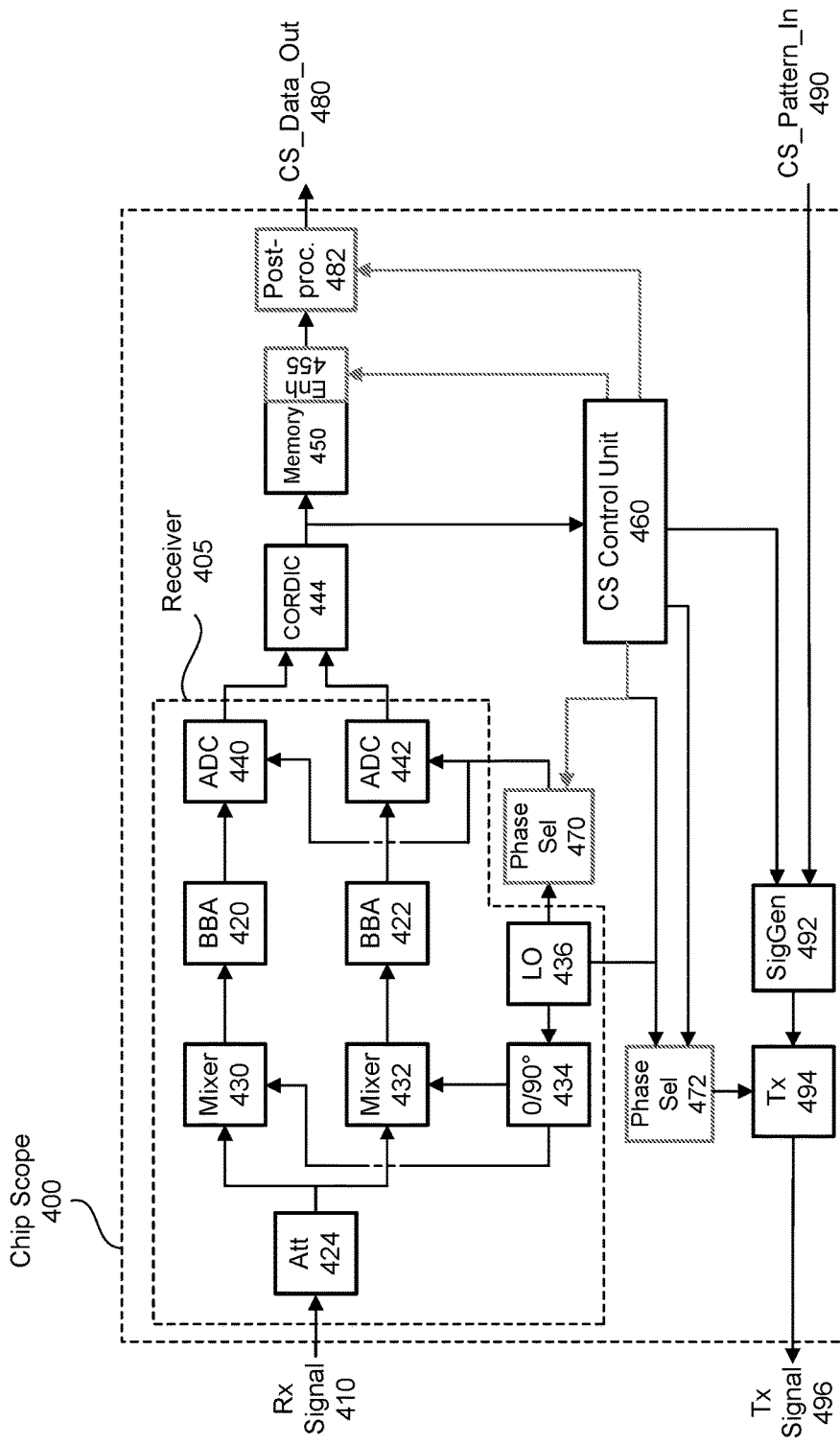
FIG. 4 shows a functional block diagram of an enhanced chip integrated scope (i.e., chip scope (CS)) with an integrated signal generator path using subsampling technique to enhanced sampling rate and resolution in accordance with some embodiments of the invention.

Chip scope (CS) 400 of FIG. 4 also includes these new enhancement blocks of FIG. 3. In summary, chip scope (CS) 300 of FIG. 3 is an enhanced version of chip scope (CS) 100 of FIG. 1 for improving sampling rate and resolution, while chip scope (CS) 400 of FIG. 4 is an enhanced version of chip scope (CS) 200 of FIG. 2 for improving sampling rate and resolution.

In this regard, FIG. 4 shows a functional block diagram of an enhanced chip integrated scope (i.e., chip scope (CS)) with an integrated signal generator path using sub sampling technique to enhanced sampling rate and resolution in accordance with some embodiments of the invention.

The chip scope (CS) 400 shown in FIG. 4 is similar to the chip scope (CS) 200 shown in FIG. 2. For example, the chip scope (CS) 400 receives a Rx (receiver) signal 410 as input, and then transmits a CS_Data_Out 480 as output. In other words, the CS 400 receives a RF (radio frequency) signal (e.g., Rx signal 410), and then transmits out a digital data sample (e.g., CS_Data_Out 480). Additionally, the chip scope (CS) 400 of FIG. 4 includes a receiver 405, a CS Control Unit 460, a CORDIC 444 (which is an optional component), and a memory 450. Furthermore, the receiver 405 includes an attenuator 424, two Mixers (430, 432), two BBA (420, 422), two ADC (440, 442), a LO 436, and an I/Q LO unit (labeled as a 0/90° unit 434).

Moreover, chip scope (CS) 400 of FIG. 4 also includes these new enhancement blocks, as compared with chip scope (CS) 200 of FIG. 2: (a) a phase selector 470, (b) an enhancement 455 applied to memory 450, (c) a post processing 482, and (d) additional connections from the CS Control Unit 460 to control these new enhancement blocks.

Figure 5:
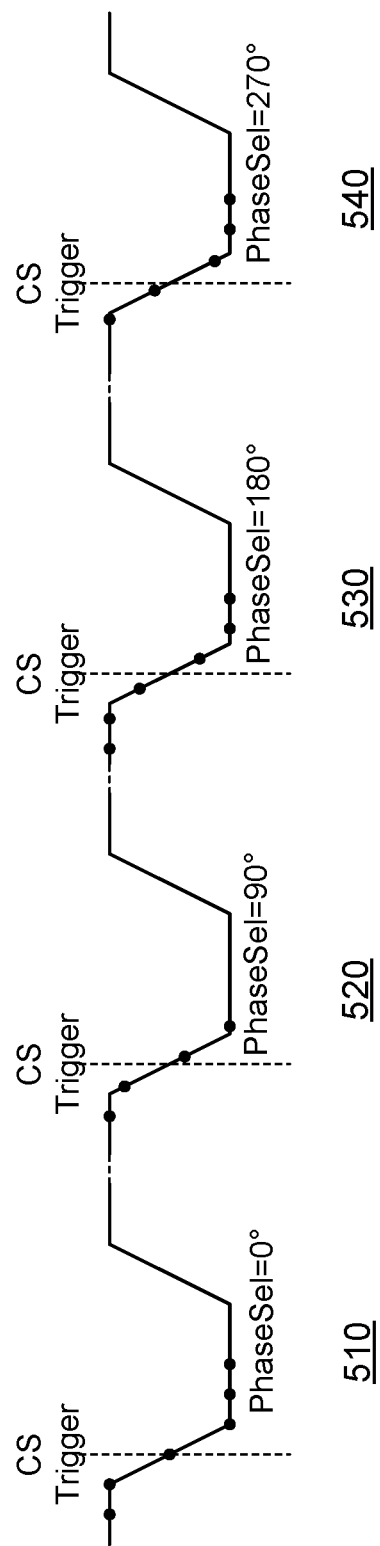
FIG. 5 shows CS (chip scope) waveforms on the subsampled individual (subsequent) traces with phase-selector of 0°, 90°, 180°, and 270°, in accordance with some embodiments of the invention.

The function of these enhancements is to capture multiple traces of a repeating test signal using different phases on the sampler (ADC) as depicted in FIG. 5. The individual captures are done at a low (available) sample-rate (i.e., a pre-determined sampling rate). However, at a post processing step, the individual captures are merged by interleaving them into one single trace as shown in FIG. 6.

Of course, this procedure implies that the signal to be captured is repeating and that the trigger repeatability is high. As an example, the rise time/fall time of a single bit to be measured in loop-back setup can be highly repeatable and the trigger might even be put on the Tx generator.

Figure 6:
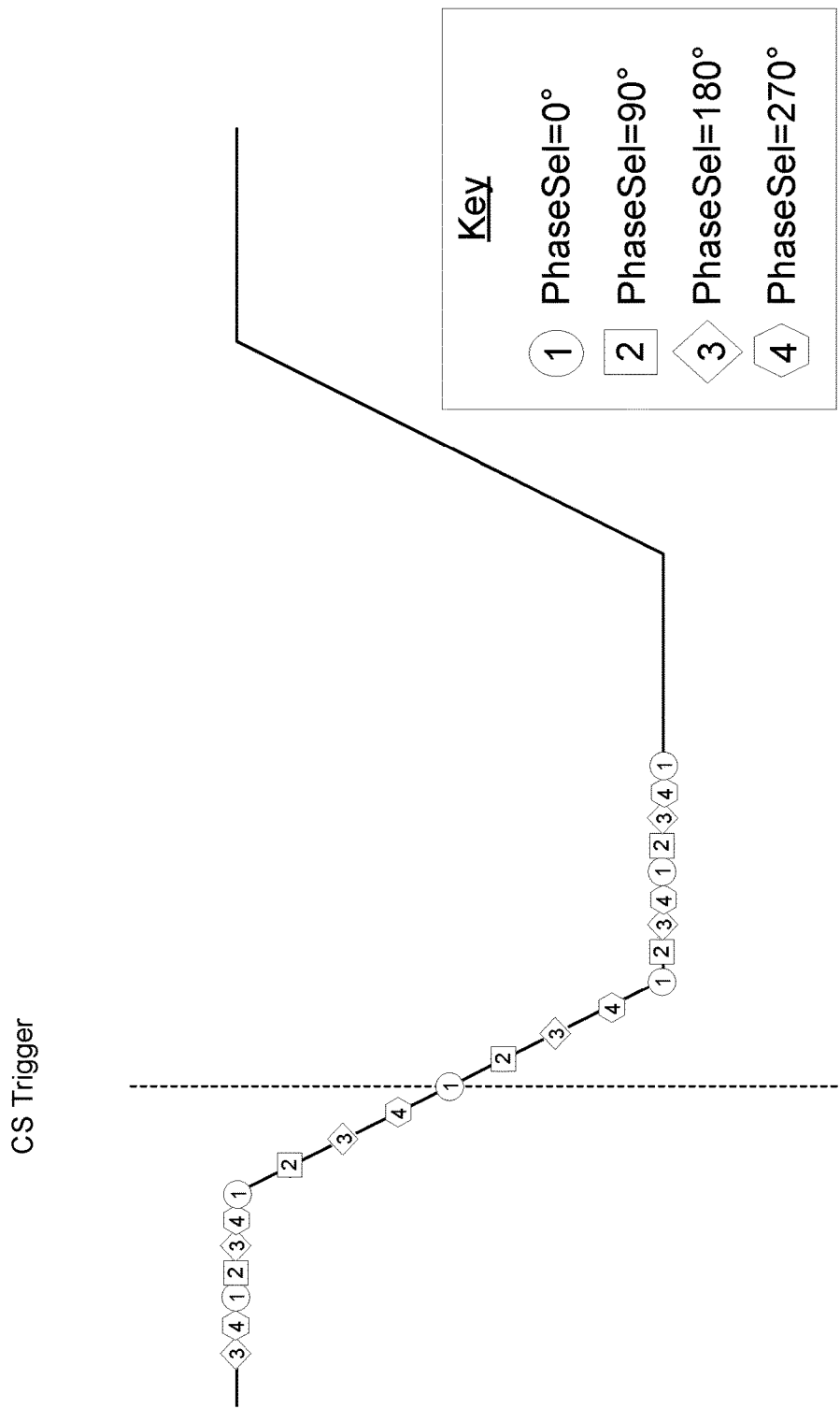
FIG. 6 shows the post-processing merging the subsampled traces (with phase-selector of 0°, 90°, 180°, and 270°) into a single trace, in accordance with some embodiments of the invention.

Next, it needs to be emphasized, the subsampling may use 4-phases (i.e., increasing the sample rate by 4, which is the embodiment shown in FIGS. 5 and 6), but other configurations and other number of phases may be possible. In general, a subsampling that uses X number of phases can increase the sample rate by X times.

Focusing on FIG. 5, we see CS (chip scope) waveforms on the subsampled individual (subsequent) traces with phase-selector of 0°, 90°, 180°, and 270°, in accordance with some embodiments of the invention. Therefore, in frame 510, the data samples are collected with a phase-selector of 0° (i.e., PhaseSel=0°). Then the signal is repeated, and now, in frame 520, the data samples are collected with a phase-selector of 90° (i.e., PhaseSel=90°). Next, the signal is again repeated, and now, in frame 530, the data samples are collected with a phase-selector of 180° (i.e., PhaseSel=180°). Finally, the signal is again repeated, and now, in frame 540, the data samples are collected with a phase-selector of 270° (i.e., PhaseSel=270°).

Meanwhile, these individual captures are saved in the memory 350 and the enhanced memory 355 of FIG. 3 (or in the memory 450 and the enhanced memory 455 of FIG. 4). At the end of these individual captures (or, in some embodiments, after a statistically sufficient number of individual captures have been collected), a post processing step (382 in FIG. 3 or 482 in FIG. 4) takes place, and the individual captures are merged by interleaving them into one single trace as shown in FIG. 6.

Focusing on FIG. 6, we see the post-processing step merges the subsampled traces (with phase-selector of 0°, 90°, 180°, and 270°) into a single trace, in accordance with some embodiments of the invention. In FIG. 6, we can see that the single trace formed from the individual captures has a higher sampling rate and resolution than the individual captures. Since the FIG. 6 embodiment uses 4-phases, the sample rate improvement is by 4 times. In general, an embodiment using X-phases can expect a X-times sample rate improvement.

The key to this subsampling technique is that the signal is repeating, and the synchronization between the different individual captures (i.e., control of phase shifts between the different individual captures). In general, this is all controlled by the CS control unit. For example, when the sequencer (e.g. state-machine) in the CS control unit initiates a single shot of the number of sweeps, the control unit "knows" exactly when this is done. Likewise, the system knows, when to expect a signal to capture on the Rx. Furthermore, the system also knows what is the impact of the different phases selected. As such, there is not at all a need to generate an explicit trigger event (e.g., on a rising/falling edge) as the CS control unit anyway knows when the pattern transmission is started.

Additionally, in FIG. 4 when the Tx signal 496 is transmitted to become the Rx signal 410, the advantages of this synchronization is very obvious, as the clock references (including the different phases) are generated as integrated signal within the SigGen—ChipScope system, so no specific circuits and/or any other extensions or additions are needed. In general for FIG. 4, the synchronization signals are basically inherent to the control of the Tx (transmitter) and Tx signal as performed by the CS control unit.

Therefore, the CS control unit can serve many purposes and functions.

In some embodiments, the CS control unit can be implemented in SW (software) or HW (hardware) or a combination of both.

In some embodiments, one function of the CS control unit is to control Rx (receiver) path for sampling.

In some embodiments, one function of the CS control unit is to control the Tx (transmitter) path for sending a pattern (e.g., such as CS_Pattern_In 490).

In some embodiments, one function of the CS control unit is to control the phase selector (for the sampling path but as well as for the signal generation path).

In some embodiments, one function of the CS control unit is to control the memory locations used to store the data.

In some embodiments, one function of the CS control unit is to act as a sequence control unit, which is a state-machine that controls: (a) when the data transmission is started (or when a repetitive pattern is generated), (b) which phase is selected, and (c) the offset. Therefore, effectively, the state-machine is controlling the trigger (which is like the sampling time reference) for the sampling.

As an example, this can be the sequence in a pseudo-code:
(1) load the Tx (transmitter) pattern;
(2) select phase x in the Rx (receiver);
(3) select memory location offset for phase x;
(4) simultaneously:
   a. start transmission,
   b. capture samples,
   c. store the data at the defined memory locations;
(5) select phase x+1 in the Rx;
(6) select memory location offset for phase x+1;
(7) continue with step (4)
where x, x+1, . . . are phases to be selected.

Note that the sequence of phases selected can be in increasing, decreasing, or any odd sequence, unless the phase selector and memory locations are aligned.

Returning to FIGS. 3 and 4, in some embodiments, the chip scope (CS) 300 (or 400) can be a device for receiving a RF (radio frequency) signal and converting the RF signal to a digital data sample. In some embodiments, the chip scope (CS) 300 (or 400) can be a device for receiving a repeating RF (radio frequency) signal and converting the repeating RF signal to a repeating digital data sample. In some embodiments, the chip scope (CS) 300 (or 400) can be a device for receiving a repeating RF (radio frequency) signal and converting the repeating RF signal to an additional repeating digital data sample. In some embodiments, the repeating digital data sample and the additional repeating digital data sample are merged by interleaving them into one single digital data sample. In some embodiments, the one single digital data sample can be a RF signal trace. In some embodiments, the chip scope (CS) 300/400 can include: (a) a receiver 305/405, (b) a CORDIC 344/444 (which is an optional component), (c) a CS (chip scope) control unit 360/460, and (d) a digital data memory 350/450. In some embodiments, the receiver 305/405 can be configured for receiving the RF signal for an NFC-enabled device, wherein NFC stands for near field communication.

In FIG. 3, phase selector 370 is controlled by CS Control Unit 360. FIG. 3 shows that phase selector 370 can receive a clock signal from LO 336, which the phase selector 370 will then use to apply the phase for ADC 342 to use for capture of the subsampled traces (i.e., individual captures with different phases). In FIG. 4, there are two phase selectors, 470 and 472. Both phase selectors, 470 and 472, are controlled by the CS Control Unit 460. Phase selector 470 is shown to receive a clock signal from LO 436, which the phase selector 470 will then use to apply the phase for ADC 442 to use for capture of the subsampled traces (i.e., individual captures with different phases). Phase selector 472 is also shown to receive a clock signal from LO 436, which the phase selector 472 will then use to apply the phase for Tx 494 to use for transmitting Tx signal 496. However, since synchronization between Tx 494 and ADC 442 (i.e., phase difference between Tx 494 and ADC 442) is the key parameter to control, CS Control Unit 460 can control either phase selector or both phase selectors to achieve the correct synchronization (i.e., the correct phase difference).

FIGS. 3 and 4 show that Rx signal 310/410 is an "external" data input to the receiver 305/405. By "external", we mean external to the chip scope 300/400. Therefore, FIGS. 3 and 4 is showing that the chip scope is receiving signal to the receiver from (a) sources external to the device. However, in general, the chip scope can be receiving signal to the receiver from (a) sources external to the device (e.g. Rx signal 310/410), (b) sources internal to the device (note: not shown in FIGS. 3 and 4), (c) a combination of sources external to the device and sources internal to the device.

In some embodiments, the receiver receives signals from the sources internal to the device via one or more of the following functional blocks of the receiver: (i) the attenuator, (ii) the mixer, (iii) the BBA, (iv) the ADC.

FIGS. 3 and 4 also show a post processing step (382/482), where the subsampled traces (i.e., individual captures with different phases) are merged into a single trace.

In some embodiments, the post processing can store the data in an interleaved manner such that the correctly merged data generates a continuous readout.

In some embodiments, the post processing can be done before storing the data into the memory.

In some embodiments, the post processing can be done in an integrated circuit (using a hardware block or a software algorithm).

In some embodiments, no post processing is done at the chip scope level, but the raw data is instead provided to a higher logical layer (e.g., host), where the post processing is done.

Figure 7:
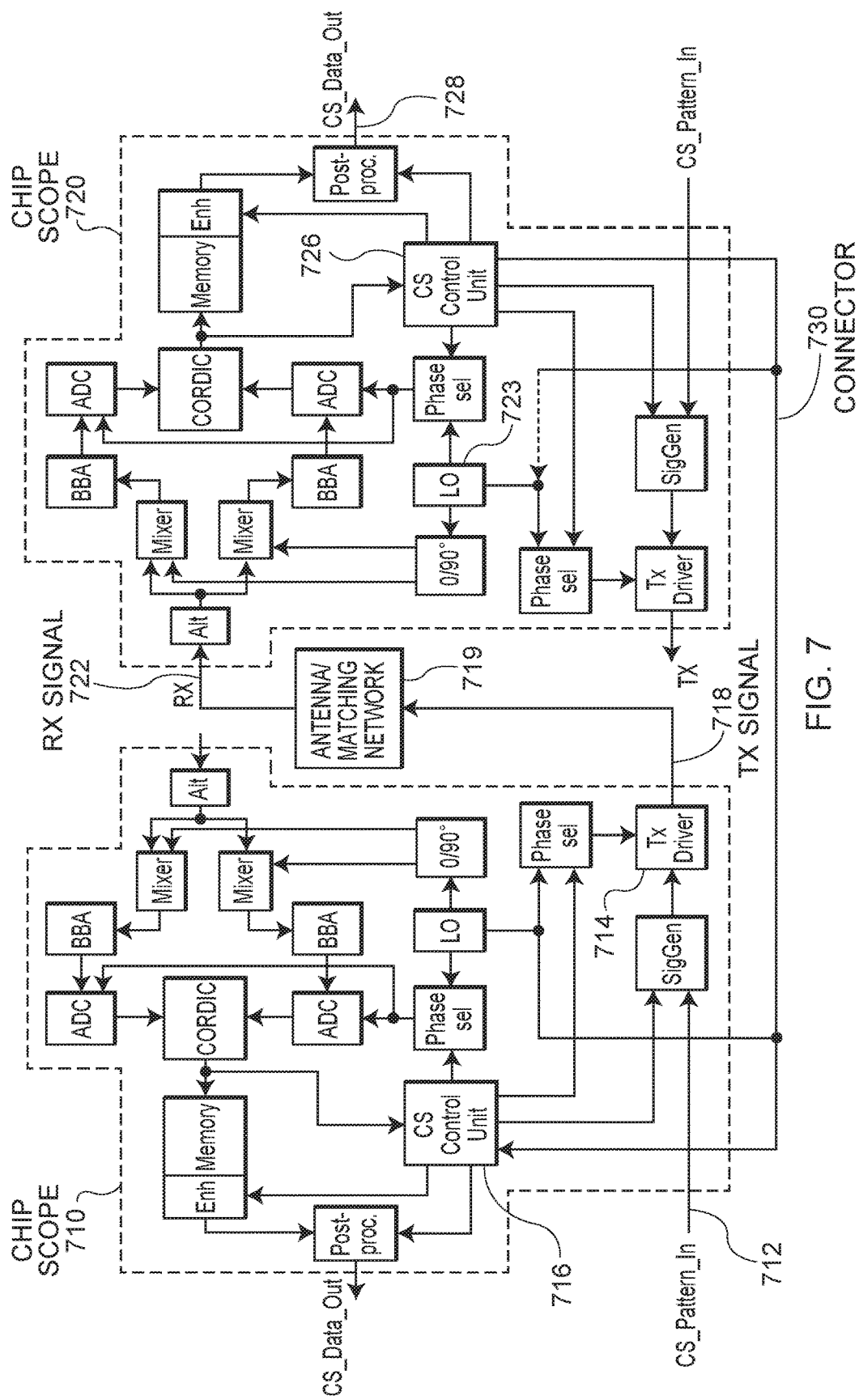
FIG. 7 shows a functional block diagram of two enhanced chip integrated scope (i.e., chip scope (CS)) in a DUT-DUT configuration (where DUT stands for device under test) using sub sampling technique to enhanced sampling rate and resolution in accordance with some embodiments of the invention.

FIG. 7 shows a functional block diagram of two enhanced chip integrated scope (i.e., chip scope (CS)) in a DUT-DUT configuration (where DUT stands for device under test) using sub sampling technique to enhanced sampling rate and resolution in accordance with some embodiments of the invention.

The DUT-DUT configuration of FIG. 7 shows two devices, one representing the signal generator (on the left), and the other representing the target device (on the right). The target device (on the right) can use the sampling part of the chip scope (i.e., receiver part), because both devices are connected via an over-the-air connection or via a conducted circuit (e.g. antenna/matching-network).

In FIG. 7, synchronization is ensured by a dedicated signal from Tx-SigGen to the Sampler (Rx-path on the target device). In this embodiment, the synchronization is based on the LO signal (i.e. LO 723) which is used as a trigger in the Rx chip scope (720), although this is just an implementation choice and other variants can also be applied.

In FIG. 7, the device (on the left) includes a chip scope 710, which can generate a Tx signal 718 using Tx (transmitter) 714. Tx 714 receives an input CS_Pattern_In 712 via a SigGen to generate the Tx signal 718. A CS Control Unit 716 is used to control the transmission of the Tx signal 718 via SigGen (i.e., signal generator).

In FIG. 7, the device (on the left) is connected to the device (on the right) via an antenna/matching-network 719. Tx signal 718 is fed as Rx signal 722 to the chip scope 720 of the device (on the right). Chip scope 720 can generate the signal trace as CS_Data_Out 728. Chip scope 720 includes a CS Control Unit 726, which controls the phase selector used to generate the signal trace CS_Data_Out 728. Synchronization between the two devices is very critical and the synchronization is achieved by having a connector 730 between the two CS Control Units (i.e., CS Control Unit 716 and CS Control Unit 726).

As stated earlier, in one embodiment, the synchronization can be based on the LO signal from LO 723 of chip scope 720. But this is just an implementation choice and other embodiments can also be implemented. For example, synchronization can also be based on the LO signal from a LO located within chip scope 710 of the device (on the left).

Figure 8:
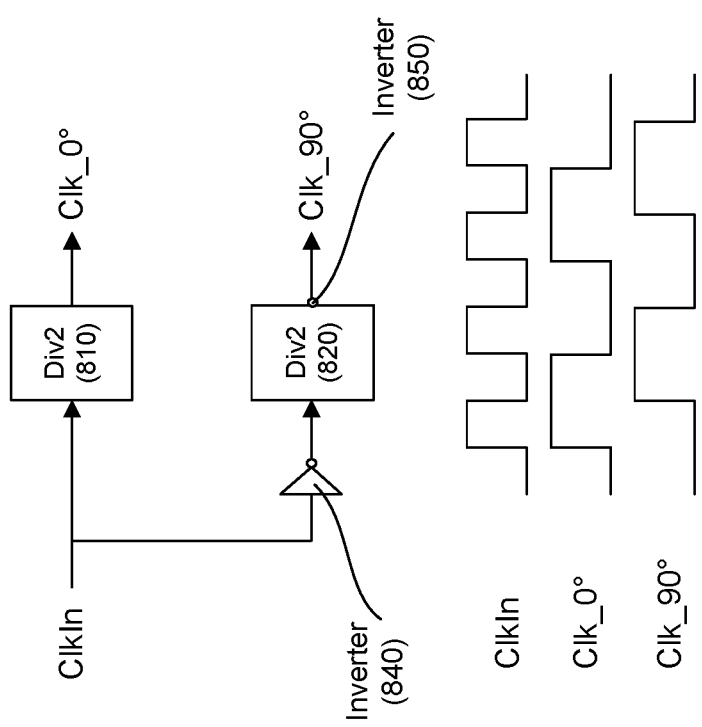
FIG. 8 shows how a clock input (ClkIn) from a LO (local oscillator) can be used to generate the clock signals for an I/Q LO unit (i.e., Clk_0° and Clk_90°), in accordance with some embodiments of the invention.

FIG. 8 shows how a clock input (ClkIn) from a LO (local oscillator) can be used to generate the clock signals for an I/Q LO unit (i.e., Clk_0° and Clk_90°), in accordance with some embodiments of the invention. A DIV2 block reduces a clock from frequency 2f to frequency f, with no phase shift. Therefore, in FIG. 8, it can be seen that the top DIV2 block (810) generates Clk_0°, which has half the frequency of ClkIn, with no phase shift. The bottom DIV2 block (820) can be used to generate the Clk_90° signal. First, an inverter (840) is used to invert the ClkIn signal. Then the bottom DIV2 block (820) reduces the frequency by a factor of 2, and an inverter (850) inverts the signal. The net result is a Clk_90° signal, which appears to be phase shifted 90° from Clk_0°. In turn, these 2 signals (i.e., Clk_0° and Clk_90°) can be used as clock signals for an I/Q LO unit, such as 0/90° unit 334 shown in FIG. 3 (or 0/90° unit 434 shown in FIG. 4).

Figure 9:
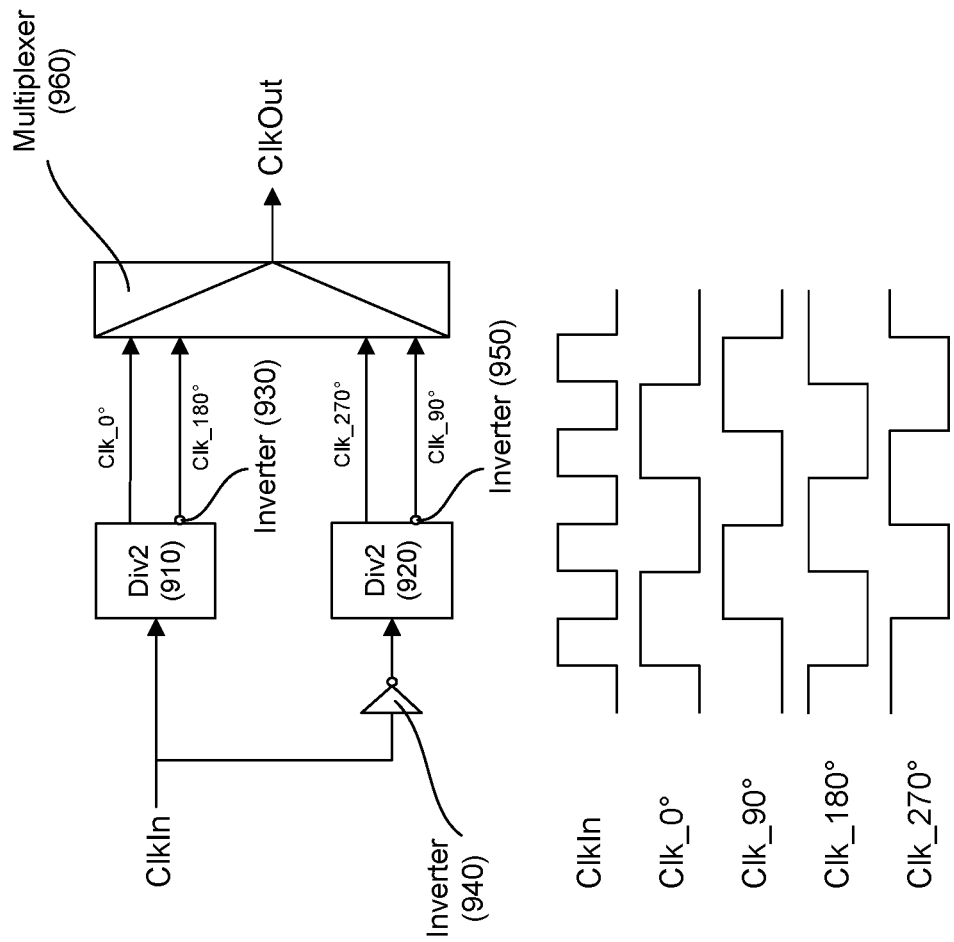
FIG. 9 shows how a clock input (ClkIn) from a LO (local oscillator) can be used to generate the clock signals for a phase selector with 4 phase shift outputs (i.e., Clk_0°, Clk_90°, Clk_180°, and Clk_270°), in accordance with some embodiments of the invention.

FIG. 9 shows how a clock input (ClkIn) from a LO (local oscillator) can be used to generate the clock signals for a phase selector with 4 phase shift outputs (i.e., Clk_0°, Clk_90°, Clk_180°, and Clk_270°), in accordance with some embodiments of the invention. A DIV2 block reduces a clock from frequency 2f to frequency f, with no phase shift. Therefore, in FIG. 9, it can be seen that the top DIV2 block (910) reduces the frequency of ClkIn by half, without adding any phase shift. This results in Clk_0°, which has half the frequency of ClkIn, with no phase shift. To generate Clk_180°, an inverter (930) first inverts the output signal from top DIV2 block (910). The net result is like inverting Clk_0°, so that the resulting signal Clk_180° looks like Clk_0° phase shifted by 180°. To generate the Clk_270° and Clk_90° signals, the bottom DIV2 block (920) is used, after the ClkIn signal has been inverted by an inverter (940). Next the bottom DIV2 block (920) halves the frequency, so the result is Clk_270°, which looks Clk_0° phase shifted by 270°. To generate Clk_90°, an inverter (950) is used to invert the output of the bottom DIV2 block (920). This is like inverting Clk_270°, which results in Clk_90°, which looks like Clk_0° phase shifted by 90°.

Finally, a multiplexer (960) is used to select one of the 4 phase shift outputs (i.e., Clk_0°, Clk_90°, Clk_180°, and Clk_270°). Therefore, the device shown in FIG. 9 can be implemented as a 4-phase selector for LO, such as phase selector 370 shown in FIG. 3 (or phase selector 470 shown in FIG. 4).

Figure 10:
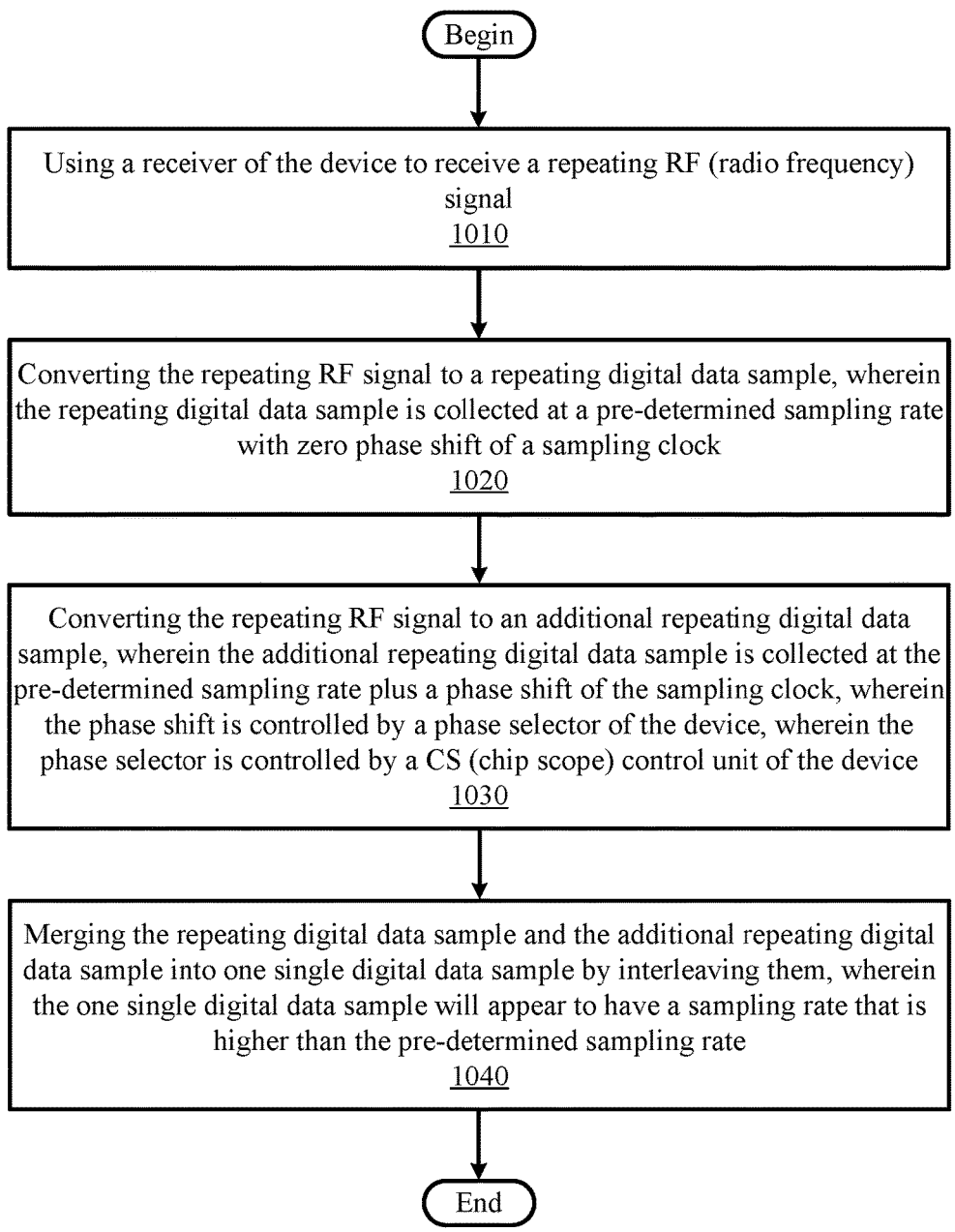
FIG. 10 shows a process flow diagram of a method to enhance sampling rate and resolution of a chip integrated scope (i.e., chip scope (CS)) by using subsampling technique in accordance with some embodiments of the invention.

FIG. 10 shows a process flow diagram of a method to enhance sampling rate and resolution of a chip integrated scope (i.e., chip scope (CS)) by using subsampling technique in accordance with some embodiments of the invention. As shown in FIG. 10, the method 1000 begins at step 1010, where the method uses a receiver of the device to receive a repeating RF (radio frequency) signal. Then, the method proceeds to step 1020. In step 1020, the method converts the repeating RF signal to a repeating digital data sample, wherein the repeating digital data sample is collected at a pre-determined sampling rate with zero phase shift of a sampling clock. Next, at step 1030, the method converts the repeating RF signal to an additional repeating digital data sample, wherein the additional repeating digital data sample is collected at the pre-determined sampling rate plus a phase shift of the sampling clock, wherein the phase shift is controlled by a phase selector of the device, wherein the phase selector is controlled by a CS (chip scope) control unit of the device. Finally, at step 1040, the method merges the repeating digital data sample and the additional repeating digital data sample into one single digital data sample by interleaving them, wherein the one single digital data sample will appear to have a sampling rate that is higher than the pre-determined sampling rate.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

The computer-useable or computer-readable medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disc, and an optical disc. Examples of optical discs include a compact disc with read only memory (CD-ROM), a compact disc with read/write (CD-R/W), a digital video disc (DVD), and a Blu-ray disc.

The various aspects, embodiments, implementations or features of the described embodiments can be used separately or in any combination. Various aspects of the described embodiments can be implemented by software, hardware or a combination of hardware and software.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A device for receiving a RF (radio frequency) signal and converting the RF signal to a digital data sample, the device comprising:
   a digital data memory;
   a receiver, the receiver configured to providing a repeating digital data sample to the digital data memory, wherein the receiver comprises a LO (local oscillator), wherein the repeating digital data sample is collected at a pre-determined sampling rate with zero phase shift of a sampling clock, wherein the sampling clock is based on the LO;
   a phase selector;
   an additional enhanced data memory configured to store an additional repeating digital data sample, wherein the additional repeating digital data sample is collected at the pre-determined sampling rate plus a phase shift of the sampling clock, wherein the phase shift is controlled by the phase selector;
   a CS (chip scope) control unit, the CS control unit configured to control the phase selector and to synchronize the repeating digital data sample with the additional repeating digital data sample,
   wherein the repeating digital data sample and the additional repeating digital data sample are merged by interleaving them into one single digital data sample, wherein the one single digital data sample will appear to have a sampling rate that is higher than the pre-determined sampling rate.

2. The device of claim 1, wherein the additional enhanced data memory is configured to store a total of three additional repeating digital data samples,
   wherein the first additional repeating digital data sample is collected at the pre-determined sampling rate plus a 90° phase shift of the sampling clock,
   wherein the second additional repeating digital data sample is collected at the pre-determined sampling rate plus a 180° phase shift of the sampling clock,
   wherein the third additional repeating digital data sample is collected at the pre-determined sampling rate plus a 270° phase shift of the sampling clock,
   wherein the repeating digital data sample and the three additional repeating digital data samples are merged by interleaving them into the one single digital data sample, wherein the one single digital data sample will appear to have a sampling rate that is four times higher than the pre-determined sampling rate.

3. The device of claim 1, wherein the additional enhanced data memory is configured to store a total of M additional repeating digital data samples,
   wherein the first additional repeating digital data sample is collected at the pre-determined sampling rate plus a $360°/(M+1)$ phase shift of the sampling clock,
   wherein the Nth additional repeating digital data sample is collected at the pre-determined sampling rate plus a $N \times 360°/(M+1)$ phase shift of the sampling clock,
   wherein the repeating digital data sample and the M additional repeating digital data samples are merged by interleaving them into the one single digital data sample, wherein the one single digital data sample will appear to have a sampling rate that is M+1 times higher than the pre-determined sampling rate.

4. The device of claim 1, wherein the one single digital data sample is a RF signal trace.

5. The device of claim 1, wherein the receiver is configured for receiving the RF signal for an NFC-enabled device, wherein NFC stands for near field communication.

6. The device of claim 1, wherein the phase selector is implemented by one or more of the following means:
   selecting different phases in a clock divider tree,
   a phase shifter circuit,
   selecting different phases in a ring oscillator,
   programmable phase in a D-PLL (digital phase lock loop).

7. The device of claim 1 further comprising:
   a signal generator, a signal generator configured to be controlled by the CS control unit;
   a transmitter, the transmitter configured to generate a RF (radio frequency) signal based on input from the signal generator.

8. The device of claim 7, wherein the transmitter provides the RF (radio frequency) signal as an input to the receiver on the same device.

9. The device of claim 8, wherein the CS control unit provides synchronization between the transmitter and the receiver on the same device.

10. The device of claim 9 further comprising:
a second phase selector associated with the transmitter,
wherein the CS control unit is configured to control both the phase selector associated with the receiver and the second phase selector associated with the transmitter,
wherein both the phase selector and the second phase selector are used in combination to control the phase shift utilized for collecting the additional repeating digital data sample.

11. The device of claim 7, wherein the transmitter provides the RF (radio frequency) signal as an input to a second receiver on a second device, wherein the second device is comprised of the second receiver and a second CS (chip scope) control unit.

12. The device of claim 11, wherein the transmitter is synchronized with the second receiver of the second device by having a connection between the CS control unit of the device with the second CS control unit of the second device.

13. The device of claim 1, wherein the receiver is further comprised of:
an attenuator,
a BBA (baseband amplifier),
a down converter, wherein the down converter is comprised of:
a mixer,
the LO (local oscillator),
an I/Q LO unit,
an ADC (analog to digital converter).

14. The device of claim 13, wherein the repeating digital data sample and the additional repeating digital data sample are based on signals the receiver receives from one of the following sources:
sources external to the device,
sources internal to the device,
a combination of sources external to the device and sources internal to the device.

15. The device of claim 14, wherein the receiver receives signals from the sources internal to the device via one or more of the following functional blocks of the receiver:
the attenuator,
the mixer,
the BBA,
the ADC.

16. The device of claim 1, wherein the CS (chip scope) control unit is configured to perform one or more of the following functions:
control receiver (Rx) path for sampling the repeating digital data sample,
control transmitter (Tx) path for generating a RF (radio frequency) signal,
control memory locations used to store the repeating digital data sample and the additional repeating digital data sample,
act as a sequence control unit, the sequence control unit controlling timing and trigger for generating a RF (radio frequency) signal and sampling the repeating digital data sample.

17. A method to enhance a chip integrated scope of a device, the method comprising:
using a receiver of the device to receive a repeating RF (radio frequency) signal;
converting the repeating RF signal to a repeating digital data sample, wherein the repeating digital data sample is collected at a pre-determined sampling rate with zero phase shift of a sampling clock;
converting the repeating RF signal to an additional repeating digital data sample, wherein the additional repeating digital data sample is collected at the pre-determined sampling rate plus a phase shift of the sampling clock, wherein the phase shift is controlled by a phase selector of the device, wherein the phase selector is controlled by a CS (chip scope) control unit of the device;
merging the repeating digital data sample and the additional repeating digital data sample into one single digital data sample by interleaving them, wherein the one single digital data sample will appear to have a sampling rate that is higher than the pre-determined sampling rate.

18. The method of claim 17 further comprising:
converting the repeating RF signal to a total of three additional repeating digital data samples,
wherein the first additional repeating digital data sample is collected at the pre-determined sampling rate plus a 90° phase shift of the sampling clock,
wherein the second additional repeating digital data sample is collected at the pre-determined sampling rate plus a 180° phase shift of the sampling clock,
wherein the third additional repeating digital data sample is collected at the pre-determined sampling rate plus a 270° phase shift of the sampling clock,
merging the repeating digital data sample and the three additional repeating digital data sample into the one single digital data sample by interleaving them, wherein the one single digital data sample will appear to have a sampling rate that is four times higher than the pre-determined sampling rate.

19. The method of claim 17 further comprising:
converting the repeating RF signal to a total of M additional repeating digital data samples,
wherein the first additional repeating digital data sample is collected at the pre-determined sampling rate plus a 360°/(M+1) phase shift of the sampling clock,
wherein the Nth additional repeating digital data sample is collected at the pre-determined sampling rate plus a N×360°/(M+1) phase shift of the sampling clock,
merging the repeating digital data sample and the M additional repeating digital data sample into the one single digital data sample by interleaving them, wherein the one single digital data sample will appear to have a sampling rate that is M+1 times higher than the pre-determined sampling rate.

20. A non-transitory computer readable medium comprising executable instructions which, when executed by a system, carry out or control the method of claim 17.

* * * * *